US010283545B2

United States Patent
Mlinar et al.

(10) Patent No.: US 10,283,545 B2
(45) Date of Patent: *May 7, 2019

(54) IMAGE SENSOR WITH NEAR-INFRARED AND VISIBLE LIGHT PIXELS

(71) Applicant: SEMICONDUCTOR COMPONENTS INDUSTRIES, LLC, Phoenix, AZ (US)

(72) Inventors: Marko Mlinar, Horjul (SI); Tomas Geurts, Haasrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/116,380

(22) Filed: Aug. 29, 2018

(65) Prior Publication Data

US 2018/0366507 A1 Dec. 20, 2018

Related U.S. Application Data

(63) Continuation of application No. 15/783,022, filed on Oct. 13, 2017, now Pat. No. 10,090,347.

(60) Provisional application No. 62/510,333, filed on May 24, 2017.

(51) Int. Cl.
  *G01J 5/08* (2006.01)
  *H04N 5/33* (2006.01)
  *H04N 9/04* (2006.01)
  *H04N 5/225* (2006.01)
  *H01L 27/146* (2006.01)

(52) U.S. Cl.
  CPC ...... *H01L 27/14627* (2013.01); *G01J 5/0862* (2013.01); *H01L 27/14621* (2013.01); *H01L 27/14643* (2013.01); *H04N 5/2257* (2013.01); *H04N 5/33* (2013.01); *H04N 9/045* (2013.01)

(58) Field of Classification Search
  CPC ......... H01L 27/14627; H01L 27/14621; H01L 27/14643
  USPC ...................................... 250/338.1
  See application file for complete search history.

(56) References Cited

U.S. PATENT DOCUMENTS

| | | |
|---|---|---|
| 2006/0221218 A1 | 10/2006 | Adler et al. |
| 2008/0131992 A1 | 6/2008 | Ma et al. |
| 2009/0200469 A1 | 8/2009 | Morin et al. |
| 2009/0278048 A1 | 11/2009 | Choe et al. |
| 2010/0289885 A1 | 11/2010 | Lu et al. |

(Continued)

*Primary Examiner* — David P Porta
*Assistant Examiner* — Meenakshi S Sahu
(74) *Attorney, Agent, or Firm* — Treyz Law Group, P.C.; Joseph F. Guihan

(57) ABSTRACT

An image sensor may include an array of imaging pixels and an array of color filter elements that covers the array of imaging pixels. The array of imaging pixels may include visible light pixels that are covered by visible light color filter elements and near-infrared light pixels that are covered by near-infrared light color filter elements. The imaging pixels may be arranged in a pattern having a repeating 2×2 unit cell of pixel groups. Each pixel group may include a visible light pixel sub-group and a near-infrared light pixel sub-group. Signals from each pixel group may be processed to determine a representative value for each pixel group that includes both visible light and near-infrared light information.

20 Claims, 9 Drawing Sheets

(56) References Cited

U.S. PATENT DOCUMENTS

| | | | |
|---|---|---|---|
| 2014/0160253 A1* | 6/2014 | Backman | G01J 3/2823 250/226 |
| 2015/0054962 A1 | 2/2015 | Borthakur et al. | |
| 2015/0062347 A1 | 3/2015 | Jin | |
| 2015/0163418 A1 | 6/2015 | Chen et al. | |
| 2015/0381907 A1 | 12/2015 | Boettiger et al. | |
| 2016/0027837 A1 | 1/2016 | Webster et al. | |
| 2016/0086999 A1 | 3/2016 | Mao et al. | |
| 2016/0163760 A1 | 6/2016 | Tsai et al. | |

\* cited by examiner

IMAGE SENSOR WITH NEAR-INFRARED AND VISIBLE LIGHT PIXELS

This application is a continuation of application Ser. No. 15/783,022, filed Oct. 13, 2017, which claims the benefit of and claims priority to provisional patent application No. 62/510,333, filed May 24, 2017, which are hereby incorporated by reference herein in their entireties.

BACKGROUND

This application relates to image sensors, and more particularly, image sensors that have visible and near-infrared pixels.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode for generating charge in response to light. Circuitry is commonly coupled to each pixel column for reading out image signals from the image pixels. A color filter element typically covers each photodiode.

Several image sensor applications (such as security cameras) require visible light and near-infrared (NIR) image sensor sensitivity at the same time. Conventional systems use a physically moveable IR filter to obtain near-infrared and visible light sensitivity. However, this is impractical and there is a strong need for a low-cost image sensor with both visible light and near-infrared (NIR) sensitivity.

It would therefore be desirable to provide image sensors with visible and near-infrared light sensitivity.

DETAILED DESCRIPTION

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
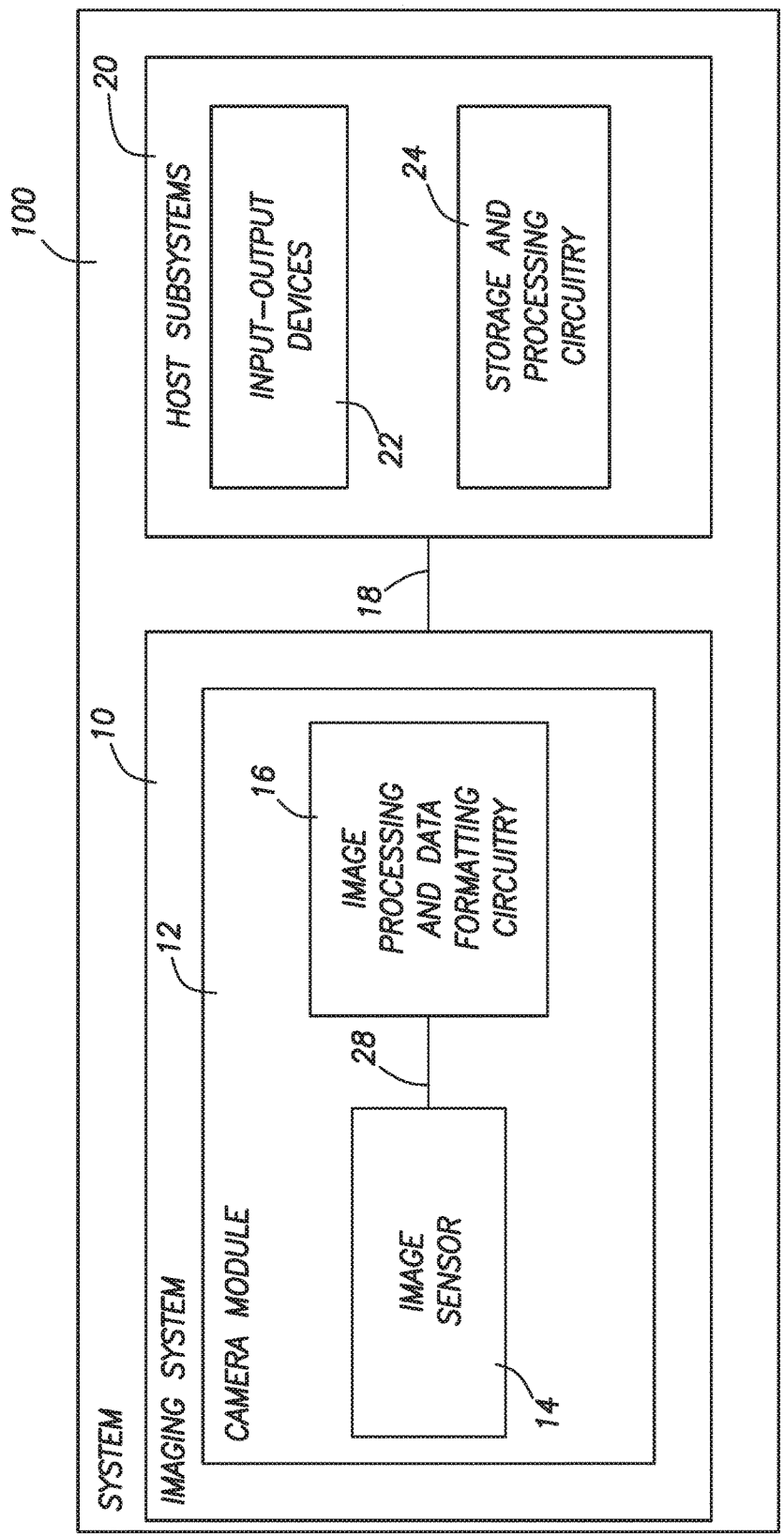
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
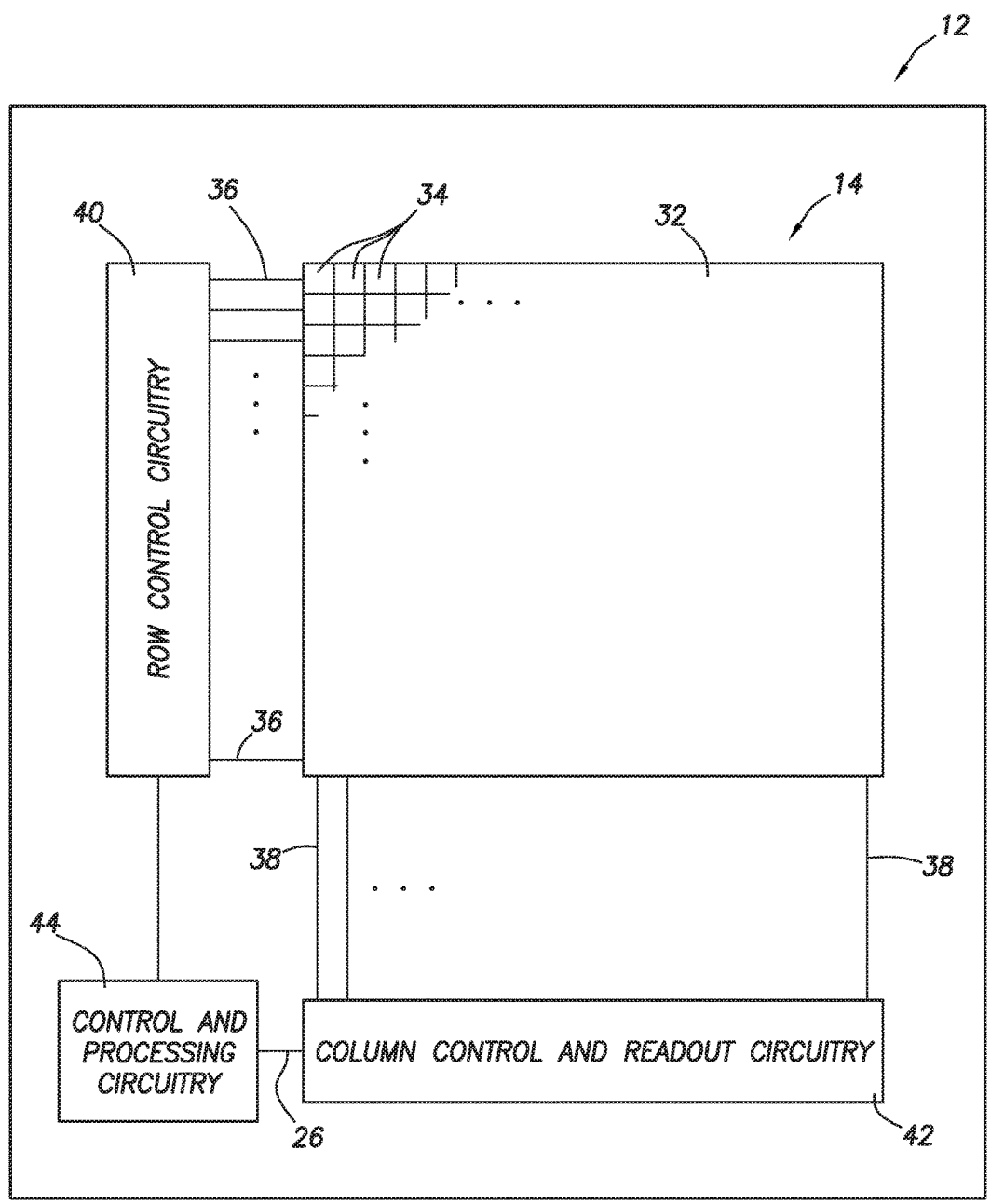
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels or image pixels 34). Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

If desired, array 32 may be part of a stacked-die arrangement in which pixels 34 of array 32 are split between two or more stacked substrates. In such an arrangement, each of the pixels 34 in the array 32 may be split between the two dies at any desired node within pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any known metal-to-metal bonding technique, such as soldering or welding.

As mentioned above, the desired node in the pixel circuit that is split across the two dies may be a floating diffusion node. Alternatively, the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source-follower transistor and a row select transistor, or any other desired node of the pixel circuit.

Figure 3:
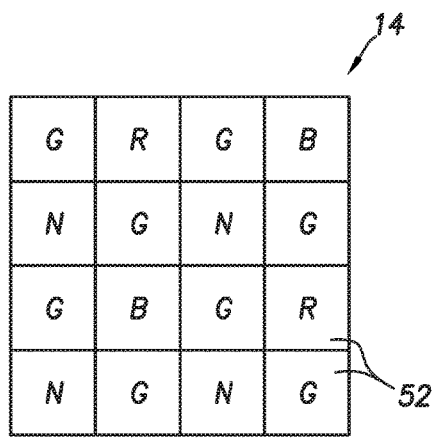
FIG. 3 shows an illustrative image sensor with a color filter pattern that may be used to provide an image sensor with both visible light and near-infrared sensitivity but that requires custom pattern processing in accordance with an embodiment.

It may be desirable for image sensor 14 to have both visible light and near-infrared (NIR) sensitivity. Accordingly, image sensor 14 may include both visible light color filter elements and near-infrared color filter elements over pixel array 32. FIG. 3 shows an illustrative image sensor 14 with a color filter pattern that may be used to provide an image sensor with both visible light and near-infrared sensitivity. Color filter elements 52 may be formed over the pixel array in a pattern. Each color filter element 52 may cover a corresponding pixel (34). Pixels with a green color filter element are labeled "G", pixels with a red color filter element are labeled "R", pixels with a blue color filter element are labeled "B", and pixels with a near-infrared color filter element are labeled "N." The pattern of FIG. 3 is a 4×4 unit cell that may be repeated across the image sensor. Although the pattern of FIG. 3 provides the image sensor with visible light and NIR sensitivity, the pattern of FIG. 3 may require custom pattern processing (because the output of image sensor 14 is a 4×4 unit square instead of a 2×2 unit square Bayer color filter pattern).

FIGS. 4-13 show illustrative image sensors with color filter patterns that may be used to provide an image sensor with both visible light and near-infrared sensitivity. Pixels with a green color filter element are labeled "G", pixels with a red color filter element are labeled "R", pixels with a blue color filter element are labeled "B", and pixels with a near-infrared color filter element are labeled "N." Pixels covered by a visible light (e.g., red, green, blue, etc.) color filter element may be referred to as visible light pixels and pixels covered by a near-infrared color filter element may be referred to as near-infrared light pixels. The patterns of FIGS. 4-13 may include 4×4 unit cells that may be repeated across the array of pixels in the imaging sensor. The patterns of FIGS. 4-13 may include strategically placed NIR pixels to minimize the amount of additional processing required to output a Bayer pattern. Since the red, green, and blue pixels are also sensitive to NIR light, these can saturate under strong NIR light (i.e. incandescent illumination), significantly reducing the dynamic range and increasing the noise even when they are not saturated. Processing may be done in a way that detects problematic, high NIR content regions and desaturates these regions (providing monochrome high-fidelity luma output), minimizing visual artifacts.

Figure 4:
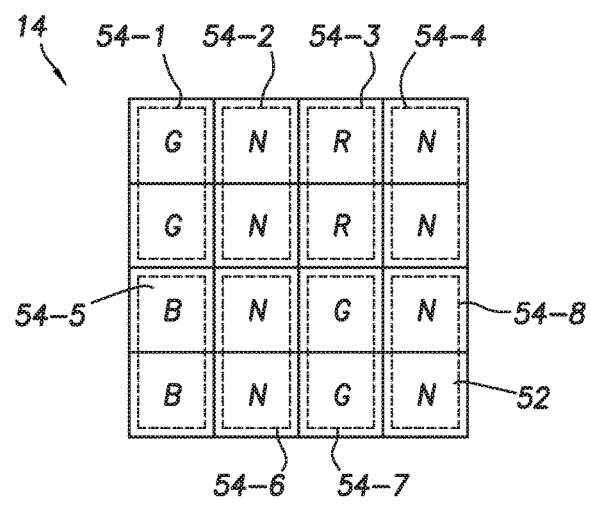
FIGS. 4-13 show illustrative image sensors with color filter patterns that may be used to provide an image sensor with both visible light and near-infrared sensitivity without requiring custom pattern processing in accordance with an embodiment.
Figure 5:
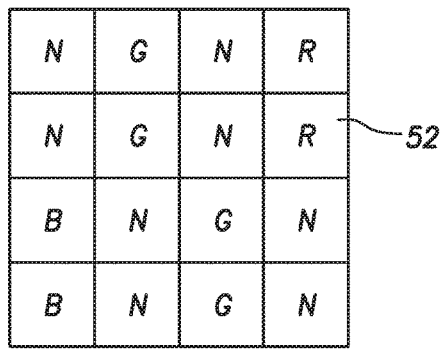

In the color filter pattern of FIG. 4, fifty percent of the pixels are NIR pixels. As shown, the pattern of FIG. 4 may include two pixels grouped together in adjacent rows and a single column (sometimes referred to as a 1×2 or 2×1 arrangement). These 1×2 groups of pixels may sometimes be referred to as sub-groups. For example, the pattern of FIG. 4 may include sub-groups 54-1 (with two green color filter elements), 54-2 (with two near-infrared color filter elements), 54-3 (with two red color filter elements), 54-4 (with two near-infrared color filter elements), 54-5 (with two blue color filter elements), 54-6 (with two near-infrared color filter elements), 54-7 (with two green color filter elements), and 54-8 (with two near-infrared color filter elements). The sub-groups may further form groups of pixels (and color filter elements). For example, sub-group 54-1 and sub-group 54-2 may form a first group, sub-group 54-3 and sub-group 54-4 may form a second group, sub-group 54-5 and sub-group 54-6 may form a third group, and sub-group 54-7 and sub-group 54-8 may form a fourth group. In other words, each group of color filter elements may be a quadrant of the 4×4 unit cell. If desired, each quadrant of the 4×4 unit cell may include a sub-group of near-infrared color filter elements and a sub-group of visible light (e.g., red, green, or blue) color filter elements.

In FIG. 4, the sub-group of visible light color filter elements in each quadrant follows the Bayer color filter pattern (with green sub-groups diagonally opposite one another and a red sub-group that diagonally opposes a blue sub-group). This may minimize the amount of processing required for an image sensor using the color filter pattern of FIG. 4 to output a Bayer-type pattern. For example, based on the color filter pattern in FIG. 4, each quadrant (or group) of pixels may be processed to obtain a value that includes visible light information and near-infrared light information. Based on the 4×4 unit square of FIG. 4, the output of the image sensor may be values associated with a 2×2 unit square (e.g., like a Bayer pattern). For example, the upper-left quadrant may have an output value associated with green light information and near-infrared information, the upper-right quadrant may have an output value associated with red light information and near-infrared information, the lower-left quadrant may have an output value associated with blue light information and near-infrared information, and the lower-right quadrant may have an output value associated with green light information and near-infrared information. The processed output may then advantageously be compatible with Bayer pattern processing techniques.

The signals from both pixels in a sub-group may be summed or averaged during processing. Each pixel may be covered by a respective microlens, or each sub-group of pixels may be covered by a respective single microlens. In some embodiments, four pixels in a 2×2 square (e.g., a group or quadrant of pixels) may be covered by a single microlens. In some embodiments (such as FIG. 6), four pixels of the same type (e.g., the two groups of 2×2 NIR pixels) may each be covered by a respective microlens (with each microlens covering four pixels). In some embodiments (such as FIG. 4), 2×2 pixel groups with different types of pixels may be covered by a single microlens. For example, in FIG. 4 the two green pixels and two NIR pixels in the upper left quadrant may be covered by a single microlens if desired.

In embodiments where multiple pixels are covered by a single microlens (i.e., a 2×1 pixel group covered by a single microlens or a 2×2 pixel group covered by a single microlens), the sensor may also be used for phase detection. The signal levels of each individual pixel may be considered to obtain phase detection information.

Figures 6, 7:
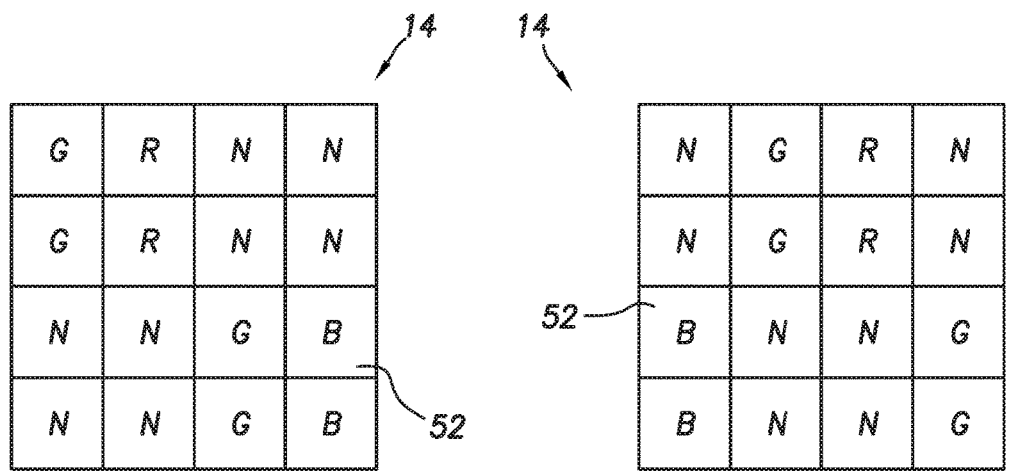
Figure 8:
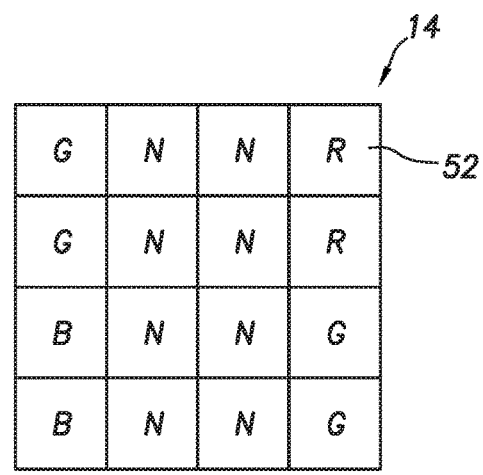
Figure 9:
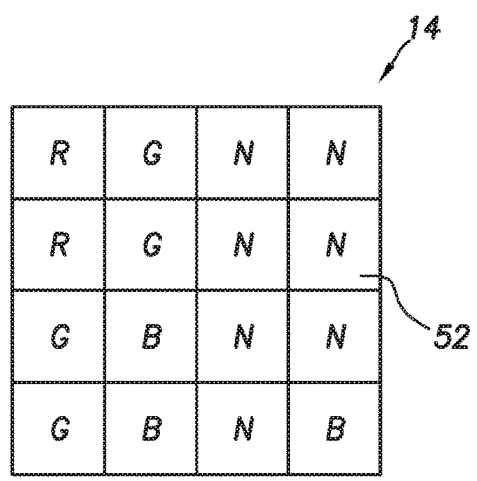
Figure 10:
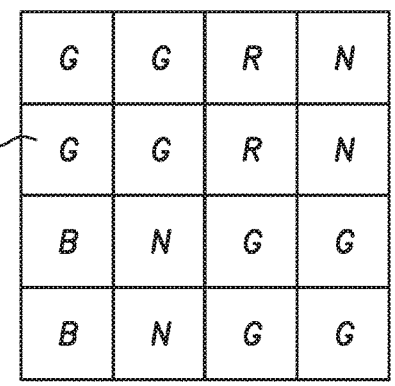
Figure 11:
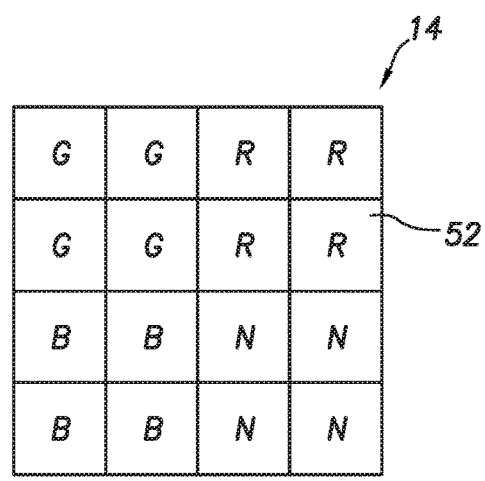
Figure 13:
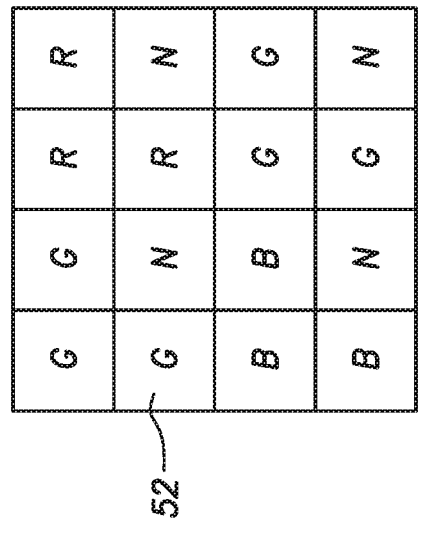
Figure 12:
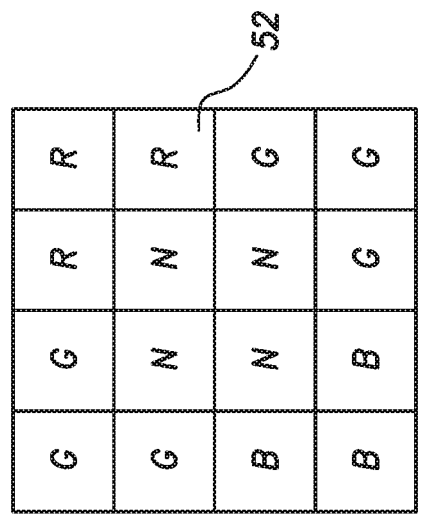

One possible advantage of the color filter pattern of FIG. 4 is that the pattern exhibits proper Bayer center-of-mass location. This may be advantageous in improving performance of the image sensor. Other color filter patterns may be also used (as shown in FIGS. 5-15). The patterns of FIGS. 5-13 may also include 4×4 unit cells that may be repeated across the array of pixels in the imaging sensor. Each pattern of FIGS. 5-13 may include both visible light color filter elements and near-infrared color filter elements. For all of the color filter patterns, processing may be performed to obtain a 2×2 unit square of output, with each value of the 2×2 square including visible light information and near-infrared light information. In the patterns of FIGS. 4-9, fifty percent of the pixels may be near-infrared pixels. In the patterns of FIGS. 10-13, twenty-five percent of the pixels may be near-infrared pixels. As shown in FIGS. 4, 5, 7, and 8, each pixel group (e.g., quadrant) of the 4×4 unit square may include two visible light pixels and two near-infrared pixels in various arrangements. In some arrangements as shown in FIGS. 6, 9, and 11, each pixel group (e.g., quadrant) of the 4×4 unit square may include either all visible light pixels or all near-infrared pixels. In some arrangements as shown in FIGS. 12 and 13, each pixel group (e.g., quadrant) of the 4×4 unit square may include may include three visible light pixels and one near-infrared pixel.

Figure 15:
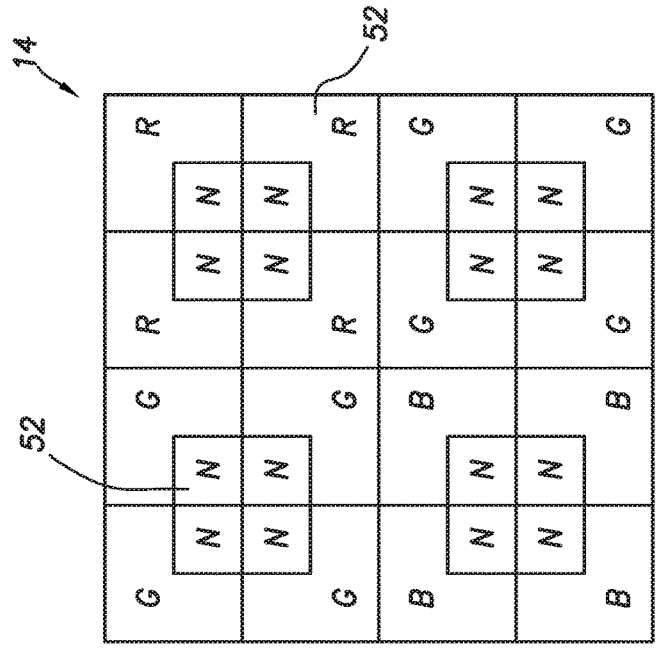
FIGS. 14 and 15 show illustrative image sensors with custom pixel layouts for visible light and near-infrared light sensitivity in accordance with an embodiment.
Figure 14:
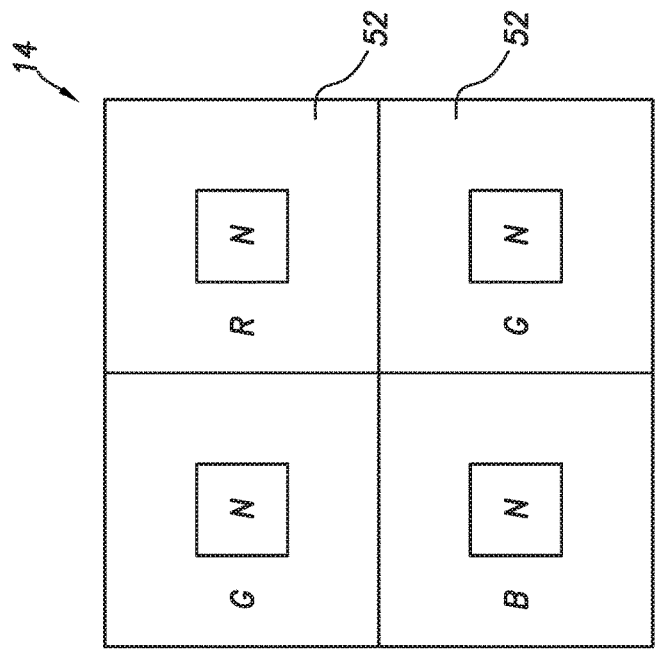

FIGS. 4-13 all show embodiments where the image sensor has an array of photodiodes arranged in rows and columns (with each photodiode being covered by a respective color filter element). However, in some cases a custom pixel layout may be used as shown in FIGS. 14 and 15. In FIG. 14, photodiodes for NIR pixels are surrounded by photodiodes for visible light pixels. A single NIR pixel may be surrounded by a single visible light pixel in each quadrant of a 2×2 unit cell. This arrangement has the advantage of proper Bayer center-of-mass location. Similarly, FIG. 15 shows an image sensor with four NIR pixels surrounded by four visible light pixels in each quadrant of a 2×2 unit cell. This arrangement also has the advantage of proper Bayer center-of-mass location. For both of the arrangements of FIGS. 14 and 15, processing may be performed to obtain a 2×2 unit square of output, with each value of the 2×2 square including visible light information and near-infrared light information.

Figure 16:
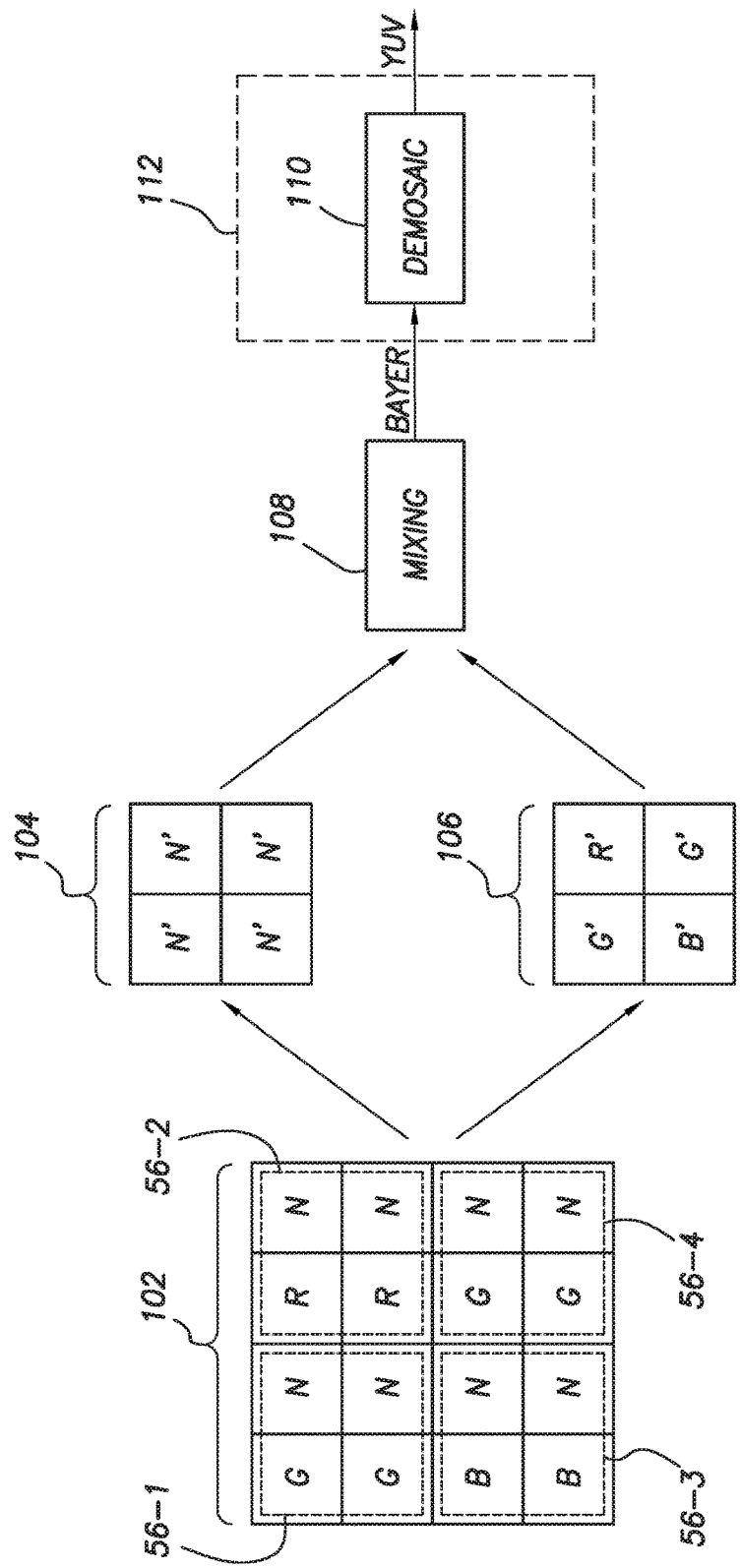
FIGS. 16 and 17 are diagrams of illustrative method steps that may be used in processing signals from an image sensor with visible light and near-infrared light sensitivity in accordance with an embodiment.
Figure 17:
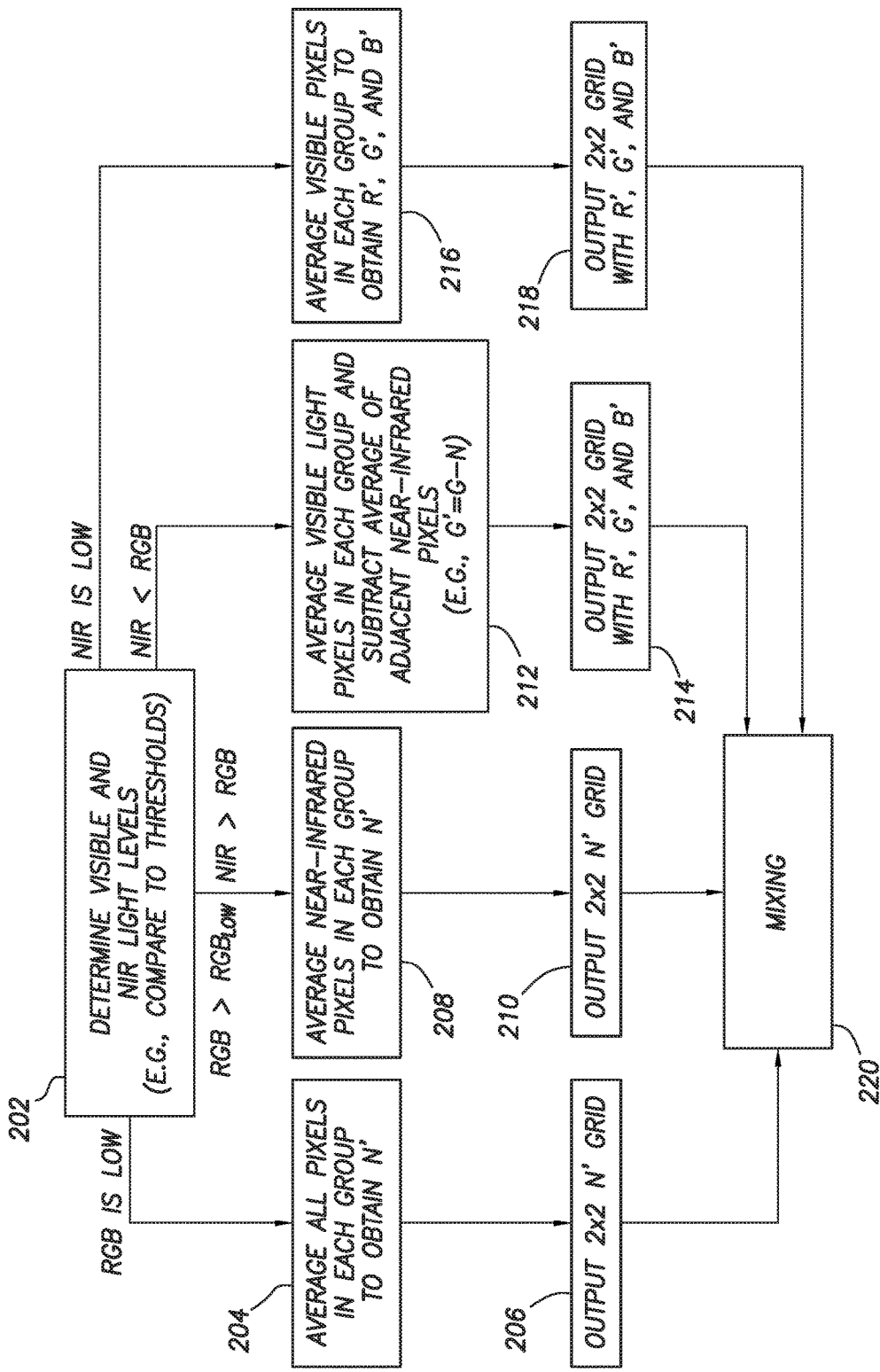

FIGS. 16 and 17 show methods used in processing signals from an image sensor that includes visible light pixels and near-infrared light pixels. FIG. 16 is a high-level diagram showing how signals from a sensor with visible light pixels and near-infrared light pixels are processed. FIG. 16 may use the color filter pattern of FIG. 4, as an example. However, these methods may be applied to any desired color filter pattern (e.g., any of the patterns of FIGS. 4-15). As shown in FIG. 16, each 4×4 unit square in the image sensor may be processed separately. An illustrative 4×4 unit square 102 (of the type shown in FIG. 4) is processed in FIG. 16. During processing, the 4×4 unit square 102 may be split into a processed near-infrared 2×2 unit square 104 and a processed visible light 2×2 unit square 106.

For example, processed near-infrared 2×2 unit square 104 may be based on the signals from near-infrared pixels in 4×4 unit square 102. For example, signals from the near-infrared pixels of group 56-1 in 4×4 unit square 102 may be used to determine the processed value N' in the upper-left quadrant of processed 2×2 unit square 104. Signals from the near-infrared pixels of group 56-2 in 4×4 unit square 102 may be used to determine the processed value N' in the upper-right quadrant of processed 2×2 unit square 104. Signals from the near-infrared pixels of group 56-3 in 4×4 unit square 102 may be used to determine the processed value N' in the lower-left quadrant of processed 2×2 unit square 104. Signals from the near-infrared pixels of group 56-4 in 4×4 unit square 102 may be used to determine the processed value N' in the lower-right quadrant of processed 2×2 unit square 104. Additional processing may be performed to obtain each N' value (e.g., adjusting the near-infrared signals based on information from neighboring visible light pixels).

Similarly, signals from the green pixels of group 56-1 in 4×4 unit square 102 may be used to determine the processed value G' in the upper-left quadrant of processed 2×2 unit square 106. Signals from the red pixels of group 56-2 in 4×4 unit square 102 may be used to determine the processed value R' in the upper-right quadrant of processed 2×2 unit square 106. Signals from the blue pixels of group 56-3 in 4×4 unit square 102 may be used to determine the processed value B' in the lower-left quadrant of processed 2×2 unit square 106. Signals from the green pixels of group 56-4 in 4×4 unit square 102 may be used to determine the processed value G' in the lower-right quadrant of processed 2×2 unit square 106. Additional processing may be performed to obtain the R', G', and B' values (e.g., adjusting the visible light signals based on information from neighboring near-infrared light pixels).

After obtaining processed near-infrared 2×2 unit square 104 and a processed visible light 2×2 unit square 106, the processed 2×2 unit squares 104 and 106 may be mixed at step 108. During mixing, the values of processed near-infrared 2×2 unit square 104 and the values of processed visible light 2×2 unit square 106 may be combined using a mixing scheme. Any desired mixing scheme may be used. In one example, the values of processed near-infrared 2×2 unit square 104 and the values of processed visible light 2×2 unit square 106 may be combined using a ratio that is determined based on the amount of visible and near-infrared light present. For example, if near-infrared light is very high and visible light is very low, the values from processed near-infrared 2×2 unit square 104 will be given a high weight during mixing and the values from processed visible light 2×2 unit square 106 will be given a very low weight during mixing. In this scenario, the values from processed near-infrared 2×2 unit square 104 may be the final output (e.g., 100% of the output may be from unit square 104 and 0% of the output may be from unit square 106). In contrast, if near-infrared light is very low and visible light is very high, the values from processed near-infrared 2×2 unit square 104 will be given a low weight during mixing and the values from processed visible light 2×2 unit square 106 will be given a very high weight during mixing. In this scenario, the values from processed visible light 2×2 unit square 106 may be the final output (e.g., 100% of the output may be from unit square 106 and 0% of the output may be from unit square 104). In other words, during the mixing step, an interpolation of the values of squares 104 and 106 may be taken (based on the visible and NIR light levels) and provided as output. The interpolation may be done on a per value basis (e.g., each quadrant may be interpolated independently) or on a per unit square basis (e.g., each quadrant may be interpolated in the same manner).

Mixing step 108 may be performed by circuitry within the system 100 (e.g., image processing and data formatting circuitry 16, storage and processing circuitry 24, etc.). The circuitry that performs mixing step 108 may be referred to as mixing circuitry. The mixing circuitry may mix monochrome image data (from processed near-infrared 2×2 unit square 104) with Bayer image data (from processed visible light 2×2 unit square 106) in step 108. If desired, white balance gains may be applied to the Bayer image data during mixing (e.g., to processed visible light 2×2 unit square 106). Alternatively, inverse white balance gains may be applied to the monochrome image data during mixing (e.g., to processed near-infrared 2×2 unit square 104).

In this way, a single output image may capture both NIR portions and visible light portions of a single scene. For example, the monochrome image data may be used in dark portions of the output image (where the scene is only illuminated with NIR light) while other portions of the same output image may use Bayer image data, creating a hybrid image that provides information regarding the scene in areas both with and without visible light.

The output from the mixing step may undergo demosaicing at step 110. Because the data output from mixing step 108 is Bayer-type data, no customizations may need to be made to demosaicing step 110. The demosaicing step may be performed by a signal processor 112 (e.g., image processing and data formatting circuitry 16, storage and processing circuitry 24, or any other desired processing circuitry). Demosaiced data (YUV data) may be output from processing circuitry 112.

FIG. 17 is a diagram of illustrative steps for processing image data from an image sensor with visible light pixels and near-infrared pixels. As shown, at step 202 processing circuitry (e.g., image processing and data formatting circuitry 16 in FIG. 1) may analyze visible and near-infrared light levels (e.g., from 4×4 unit square 102 in FIG. 16). One or more processing paths may then be chosen based on the visible and near-infrared light levels (e.g., the processing path including steps 204 and 206, the processing path including steps 208 and 210, the processing path including steps 212 and 214, and/or the processing path including the steps 216 and 218). If desired, the signals from visible and near-infrared light pixels in 4×4 unit square 102 may be compared to thresholds while determining the light levels. Processing the signals based on the light levels may help account for the visible light pixels also being sensitive to near-infrared light. Because the visible light pixels are sensitive to near-infrared light, the signals from the visible light pixels may include contributions from both visible and near-infrared light. This may be accounted for during processing based on the levels of both near-infrared and visible light.

If the visible light level is determined to be low (e.g., if a signal from one visible light pixel, the signals from all visible light pixels, and/or an average signal from two or more visible light pixels is below a given threshold such as $RGB_{LOW}$), processing may proceed to step 204. In step 204, the signals from each pixel in each group (e.g., quadrant) of unit square 102 may be averaged to obtain a representative near-infrared signal N' for that group. For example, looking at FIG. 16, the signals from the four pixels in group 56-1 may be averaged to obtain N' in the upper-left quadrant of unit square 104, the signals from the four pixels in group 56-2 may be averaged to obtain N' in the upper-right quadrant of unit square 104, etc. This may produce a 2×2 grid of representative N' values that is output at step 206.

If, as determined at step 202, the visible light level is not low (e.g., if a signal from one visible light pixel, the signals from all visible light pixels, and/or an average signal from two or more visible light pixels is above a given threshold such as $RGB_{LOW}$) and there is more near-infrared light than visible light (e.g., NIR>RGB), processing may proceed to step 208. In step 208, the signals from each near-infrared pixel in each group (e.g., quadrant) of unit square 102 may be averaged to obtain a representative near-infrared signal N' for that group. For example, looking at FIG. 16, the signals from the two near-infrared pixels in group 56-1 may be averaged to obtain N' in the upper-left quadrant of unit square 104, the signals from the two near-infrared pixels in group 56-2 may be averaged to obtain N' in the upper-right quadrant of unit square 104, etc. This may produce a 2×2 grid of representative N' values that is output at step 210.

If there is less near-infrared light than visible light (e.g., NIR<RGB), than processing may proceed from step 202 to step 212. At step 212, the signals from each visible light pixel in each group may be averaged. The signals from near-infrared pixels that are adjacent to the visible light pixels may then be averaged. The difference between the average visible light pixel signal and the average near-infrared light pixel signal may be used as a representative signal (e.g., R', G', or B') for that group. For example, consider group 56-2 in FIG. 16. First, the average of the signals from the two red pixels in group 56-2 may be obtained. Next, the average of the signals from the four adjacent near-infrared pixels (e.g., the two NIR pixels in group 56-2 and the two NIR pixels in group 56-1) may be obtained. The difference in the two averages may be obtained to determine R' for the upper-right quadrant of unit square 106 in FIG. 16. This process may be continued for each group of pixels to produce a 2×2 grid of representative R', G', and B' values (e.g., processed visible light 2×2 unit square 106 in FIG. 16) that is output at step 214.

If the near-infrared light levels are low (e.g., if a signal from one near-infrared light pixel, the signals from all near-infrared light pixels, and/or an average signal from two or more near-infrared light pixels is below a given threshold such as $NIR_{LOW}$), processing may proceed from step 202 to step 216. The signals from each visible light pixel in each group may be averaged to obtain a representative signal (R', G', or B') for that group. For example, the signals from the two green pixels in group 56-1 may be averaged to obtain G' in the upper-left quadrant of unit square 106, the signals from the two red pixels in group 56-2 may be averaged to obtain R' in the upper-right quadrant of unit square 106, etc. The resulting 2×2 grid of representative R', G', and B' values (e.g., processed visible light 2×2 unit square 106 in FIG. 16) is output at step 218.

During step 220, the outputs from steps 206, 210, 214, and/or 218 may be mixed. Depending on the light levels determined in step 202, processing may produce outputs from one, two, three, or four of the four illustrative processing paths. The outputs from each of the processing paths may be mixed at step 220 based on the light levels. For example, during mixing the processing circuitry may smoothly interpolate between any of the four possible outputs. If desired, white balance gains may be applied to the RGB data during mixing (e.g., to the outputs from steps 214 or 218). Alternatively, inverse white balance gains may be applied to the NIR data during mixing (e.g., to the outputs from steps 206 or 210) then white balance gains may be applied during subsequent processing.

As discussed above in connection with FIG. 16, circuitry may mix monochrome image data (e.g., outputs from steps 206 and/or 210) with Bayer image data (e.g., outputs from steps 214 and/or 218) at step 220. In this way, a single output image may capture both NIR portions and visible light portions of a single scene. For example, the monochrome image data may be used in dark portions of the output image (where the scene is only illuminated with NIR light) while other portions of the same output image may use Bayer image data, creating a hybrid image that provides information regarding the scene in areas both with and without visible light.

It should be noted that during any of the aforementioned processing steps of FIG. 17, a low pass filter may be applied to the signals. For example, a low pass filter may be applied to the raw data from the pixels (e.g., the 4×4 unit square 102 of FIG. 16) or to the processed 2×2 unit squares (e.g., the outputs from steps 206, 210, 214 and/or 218). Similarly, all of the aforementioned processing steps may utilize resampling to match spatial locations of the output.

Importantly, the output of mixing step 220 (which may the same as mixing step 108 in FIG. 16) may be a Bayer pattern (e.g., a repeating 2×2 unit cell of values with two values including green light information, one value including red light information, and one value including blue light information in each 2×2 unit cell). By enabling the processor (e.g., processor 112 in FIG. 16 that performs demosaicing) to receive a Bayer pattern, the processor can be saved from having to perform custom pattern processing.

In the aforementioned embodiments, various color filter patterns are described as having visible light color filter elements and near-infrared color filter elements. It should be noted that these color filter patterns are merely illustrative. Different color filter elements may be substituted for the visible light color filter elements if desired. For example, a clear color filter element may be used in place of the green color filter elements if desired. Green color filter elements, red color filter elements, blue color filter elements, yellow color filter elements, cyan color filter elements, magenta color filter elements, broadband color filter elements (e.g., clear color filter elements, yellow color filter elements, etc.), and/or any other desired color filter elements may be used in place of the red, green, and/or blue color filter elements. Similarly, different color filter elements may be substituted for the near-infrared light color filter elements if desired. For example, clear color filter elements or another type of broadband color filter element may be used in place of the near-infrared light color filter elements if desired. The channel including the near-infrared (and/or other desired color filter elements) may sometimes be referred to as a high fidelity or high sensitivity channel.

The aforementioned embodiments may provide an image sensor with visible light and NIR sensitivities at a negligible increase in cost compared to a sensor with a Bayer color filter. The aforementioned embodiments provide an ecosystem friendly solution that allows straightforward integration. The aforementioned embodiments may have sufficient performance in both indoor and outdoor lighting conditions.

In various embodiments, an image sensor may include an array of imaging pixels comprising visible light pixels and near-infrared light pixels and an array of color filter elements that cover the array of imaging pixels. The imaging pixels may be arranged in a pattern, the pattern may include a repeating 2×2 unit cell of pixel groups, and each pixel group may include a visible light pixel sub-group and a near-infrared light pixel sub-group.

The visible light pixel sub-group of each pixel group may include first and second adjacent visible light pixels. The near-infrared light pixel sub-group of each pixel group may include first and second adjacent near-infrared light pixels. The 2×2 unit cell of pixel groups may include first, second, third, and fourth pixel groups. The visible light pixel sub-group of the first pixel group may include a green pixel sub-group, the visible light pixel sub-group of the second pixel group may include a red pixel sub-group, the visible light pixel sub-group of the third pixel group may include a blue pixel sub-group, and the visible light pixel sub-group of the fourth pixel group may include a green pixel sub-group.

The near-infrared light pixel sub-group of the first pixel group may be interposed between the green pixel sub-group of the first group and the red pixel sub-group of the second pixel group and the near-infrared light pixel sub-group of the third pixel group may be interposed between the blue pixel sub-group of the third pixel group and the green pixel sub-group of the fourth pixel group. The red pixel sub-group of the second pixel group may be interposed between the near-infrared light pixel sub-group of the first pixel group and the near-infrared light pixel sub-group of the second pixel group and the green pixel sub-group of the fourth pixel group may be interposed between the near-infrared light pixel sub-group of the third pixel group and the near-infrared light pixel sub-group of the fourth pixel group. The near-infrared light pixel sub-group of the second pixel group may be interposed between the near-infrared light pixel sub-group of the first pixel group and the red pixel sub-group of the second pixel group and the near-infrared light pixel sub-group of the fourth pixel group may be interposed between the near-infrared light pixel sub-group of the third pixel group and the green pixel sub-group of the fourth pixel group. The green pixel sub-group of the first pixel group may be interposed between the near-infrared light pixel sub-group of the first group and the near infrared-light pixel sub-group of the second pixel group and the near-infrared light pixel sub-group of the third pixel group may be interposed between the blue pixel sub-group of the third pixel group and the green pixel sub-group of the fourth pixel group.

The image sensor may also include a plurality of microlenses. Each visible light pixel sub-group may be covered by a single respective microlens of the plurality of microlenses and each near-infrared light pixel sub-group may be covered by a single respective microlens of the plurality of microlenses. The imaging pixels of at least one pixel group may be covered by a single microlens. The image sensor may also include processing circuitry that processes signals from the pixel groups and outputs a corresponding Bayer pattern to a processor for demosaicing. The processing circuitry may be configured to process signals from the visible light pixel sub-group and signals from the near-infrared light pixel sub-group to obtain a first processed set of image data and a second processed set of image data for each pixel group of the repeating 2×2 unit cell of pixel groups. The first processed set of image data may be a set of monochrome image data and the second processed set of image data may be a set of Bayer image data. The processing circuitry may be configured to mix the set of monochrome image data with the set of Bayer image data into a set of output data that includes both near-infrared light information and visible light information and output the set of output data to a processor for demosaicing In various embodiments, an image sensor may include a plurality of photodiodes and a plurality of color filter elements arranged in a pattern. Each photodiode of the plurality of photodiodes may be covered by a respective color filter element of the plurality of color filter elements, the pattern may include a repeating 2×2 unit cell of groups, and each group may include a first sub-group of visible light color filter elements and a second sub-group of near-infrared light color filter elements.

The first sub-group of each group may include first and second adjacent visible light color filter elements. The second sub-group of each group may include first and second adjacent near-infrared light color filter elements. The 2×2 unit cell of groups may include first and second groups above third and fourth groups, the first sub-group of the first pixel group may include first and second adjacent green color filter elements, the first sub-group of the second group may include first and second adjacent red color filter elements, the first sub-group of the third group may include first and second adjacent blue color filter elements, and the first sub-group of the fourth group may include first and second adjacent green color filter elements.

In various embodiments, a method of processing signals from an array of imaging pixels that includes visible light pixels and near-infrared light pixels may include receiving signals from a 4×4 unit cell of imaging pixels that includes first, second, third and fourth groups of imaging pixels, for each group of imaging pixels, processing the received signals to obtain a single representative value for the group of imaging pixels, and outputting the representative value for each group of imaging pixels in a Bayer pattern. Each group of imaging pixels may include both visible light pixels and near-infrared light pixels.

Processing the received signals for the first group of imaging pixels may include determining the average of the signals from the visible light pixels and the near-infrared light pixels of the first group. Processing the received signals for the first group of imaging pixels may include determining the average of the signals from the near-infrared light pixels of the first group. Processing the received signals for the first group of imaging pixels may include determining a first average of the signals from the near-infrared light pixels of the first group, determining a second average of the signals from the visible light pixels of the first group, and subtracting the first average from the second average. Processing the received signals for the first group of imaging pixels may include determining the average of the signals from the visible light pixels of the first group.

The foregoing is merely illustrative of the principles of this invention and various modifications can be made by those skilled in the art. The foregoing embodiments may be implemented individually or in any combination.

What is claimed is:

1. An image sensor comprising:
   a plurality of photodiodes; and
   a plurality of color filter elements arranged in a pattern, wherein each photodiode of the plurality of photodiodes is covered by a respective color filter element of the plurality of color filter elements, wherein the pattern comprises a repeating 2×2 unit cell of groups, and wherein each group comprises at least a first color filter element of a first type that is surrounded by at least a first color filter element of a second type that is different than the first type.

2. The image sensor defined in claim 1, wherein the at least first color filter element of the first type comprises a near-infrared light color filter element.

3. The image sensor defined in claim 2, wherein the at least first color filter element of the second type comprises a visible light color filter element.

4. The image sensor defined in claim 3, wherein the 2×2 unit cell of groups has first, second, third, and fourth groups, wherein the visible light color filter element of the first group is a green color filter element, wherein the visible light color filter element of the second group is a red color filter element, wherein the visible light color filter element of the third group is a blue color filter element, and wherein the visible light color filter element of the fourth group is a green color filter element.

5. The image sensor defined in claim 1, wherein the at least first color filter element of the first type is a single near-infrared light color filter element and wherein the at least first color filter element of the second type is a single visible light color filter element.

6. The image sensor defined in claim 1, wherein the at least first color filter element of the first type comprises first and second near-infrared light color filter elements.

7. The image sensor defined in claim 6, wherein the at least first color filter element of the second type comprises first and second visible light color filter elements.

8. The image sensor defined in claim 1, wherein the at least first color filter element of the first type comprises first, second, third, and fourth near-infrared light color filter elements.

9. The image sensor defined in claim 8, wherein the at least first color filter element of the second type comprises first, second, third, and fourth visible light color filter elements.

10. The image sensor defined in claim 1, wherein each group in the repeating 2×2 unit cell of groups is covered by a single microlens.

11. The image sensor defined in claim 1, wherein each photodiode is configured to obtain phase detection information.

12. An image sensor comprising:
a plurality of pixels arranged in a pattern, wherein the pattern comprises a repeating 2×2 unit cell of groups, wherein each group comprises at least one near-infrared light pixel and at least one visible light pixel and wherein at least one pixel in each group is configured to obtain phase detection information.

13. The image sensor defined in claim 12, wherein each group comprises first and second visible light pixels that are covered by a single microlens.

14. The image sensor defined in claim 12, wherein each group comprises first and second near-infrared light pixels that are covered by a single microlens.

15. The image sensor defined in claim 12, wherein each group comprises first and second visible light pixels and first and second near-infrared light pixels that are covered by a single microlens.

16. The image sensor defined in claim 12, wherein each near-infrared light pixel comprises a photodiode covered by a respective near-infrared light color filter element and wherein each visible light pixel comprises a photodiode covered by a respective visible light color filter element.

17. An image sensor comprising:
a plurality of photodiodes;
a plurality of color filter elements, wherein each photodiode of the plurality of photodiodes is covered by a respective color filter element of the plurality of color filter elements and wherein the plurality of color filter elements includes a visible light color filter element formed over a first photodiode and a near-infrared light color filter element formed over a second photodiode; and
a microlens that covers the first and second photodiodes.

18. The image sensor defined in claim 17, wherein the plurality of color filter elements includes an additional visible light color filter element formed over a third photodiode and an additional near-infrared light color filter element formed over a fourth photodiode and wherein the microlens covers the first, second, third, and fourth photodiodes.

19. The image sensor defined in claim 17, wherein the visible light color filter element is a first visible light color filter element, wherein the plurality of color filter elements includes second, third, and fourth visible light color filter elements formed over respective third, fourth, and fifth photodiodes, wherein the near-infrared light color filter element is a first near-infrared light color filter element, and wherein the plurality of color filter elements includes second, third, and fourth near-infrared light color filter elements formed over respective sixth, seventh, and eighth photodiodes.

20. The image sensor defined in claim 19, wherein the microlens covers the first, second, third, fourth, fifth, sixth, seventh, and eight photodiodes.

* * * * *